United States Patent [19]

Suzuki et al.

[11] Patent Number: 5,035,753
[45] Date of Patent: Jul. 30, 1991

[54] PHOTOELECTRIC CONVERSION DEVICE

[75] Inventors: Kunio Suzuki, Tokyo; Masayoshi Abe, Tama; Mikio Kinka, Nonichimachi; Yasuyuki Arai, Atsugi; Akemi Satake, Yokohama; Kazuo Nishi, Sagamihara; Shuichi Kugawa, Atsugi; Noriya Ishida, Asahikawa, all of Japan

[73] Assignee: Semiconductor Energy Laboratory Co., Ltd., Atsugi, Japan

[21] Appl. No.: 453,310

[22] Filed: Dec. 22, 1989

[30] Foreign Application Priority Data

Dec. 27, 1988 [JP] Japan ................................ 63-335632

[51] Int. Cl.$^5$ .................. H01L 31/042; H01L 31/075
[52] U.S. Cl. ...................................... 136/249; 136/244
[58] Field of Search ........................... 136/244, 249 TJ

[56] References Cited

U.S. PATENT DOCUMENTS

| | | |
|---|---|---|
| 4,334,120 | 6/1982 | Yamano et al. ............... 136/248 |
| 4,400,577 | 8/1983 | Spear ............................. 136/259 |
| 4,604,636 | 8/1986 | Dalal .............................. 357/2 |
| 4,790,883 | 12/1988 | Sichanugrist et al. ......... 136/258 |

Primary Examiner—Aaron Weisstuch
Attorney, Agent, or Firm—Sixbey, Friedman, Leedom & Ferguson

[57] ABSTRACT

A solar cell comprises a plurality of series connected photoelectric conversion structures formed on a substrate. The conversion structure consists of a first semiconductor film on a P-type, an intrinsic semiconductor film formed on the first semiconductor film such that one end thereof extends beyond an end of the first semiconductor film and a second semiconductor film of a second, opposite conductivity type formed on the intrinsic semiconductor film such that one end thereof extends beyond the extended end of the intrinsic semiconductor film and makes direct electrical contact with an end of the first semiconductor film of the adjacent structure.

11 Claims, 5 Drawing Sheets

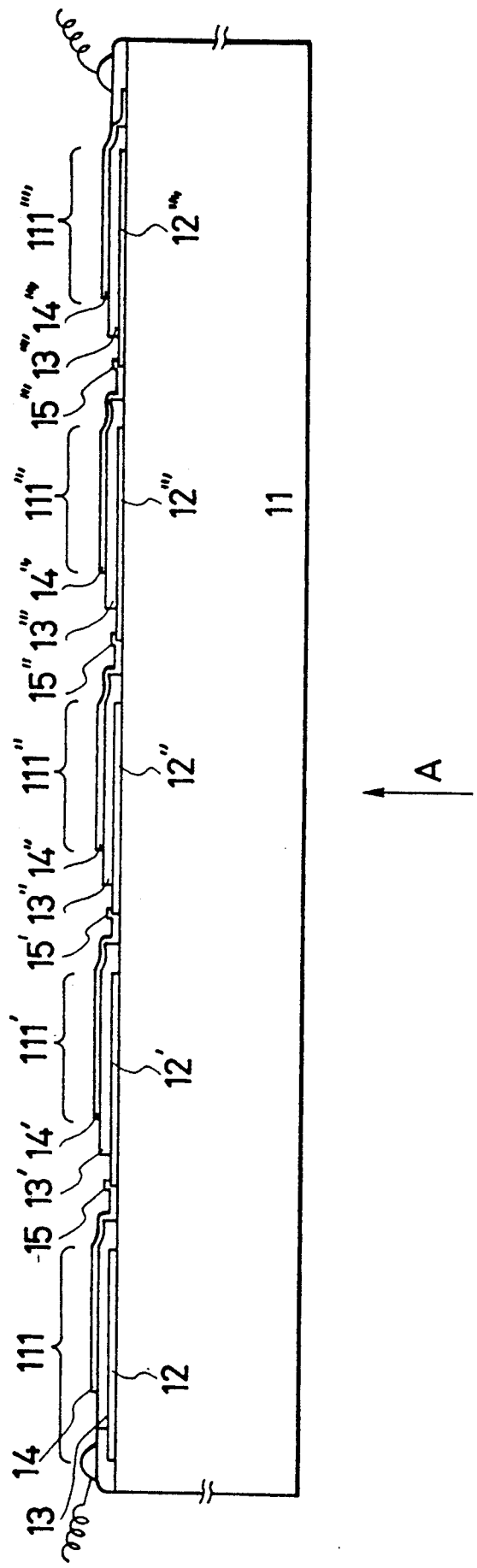

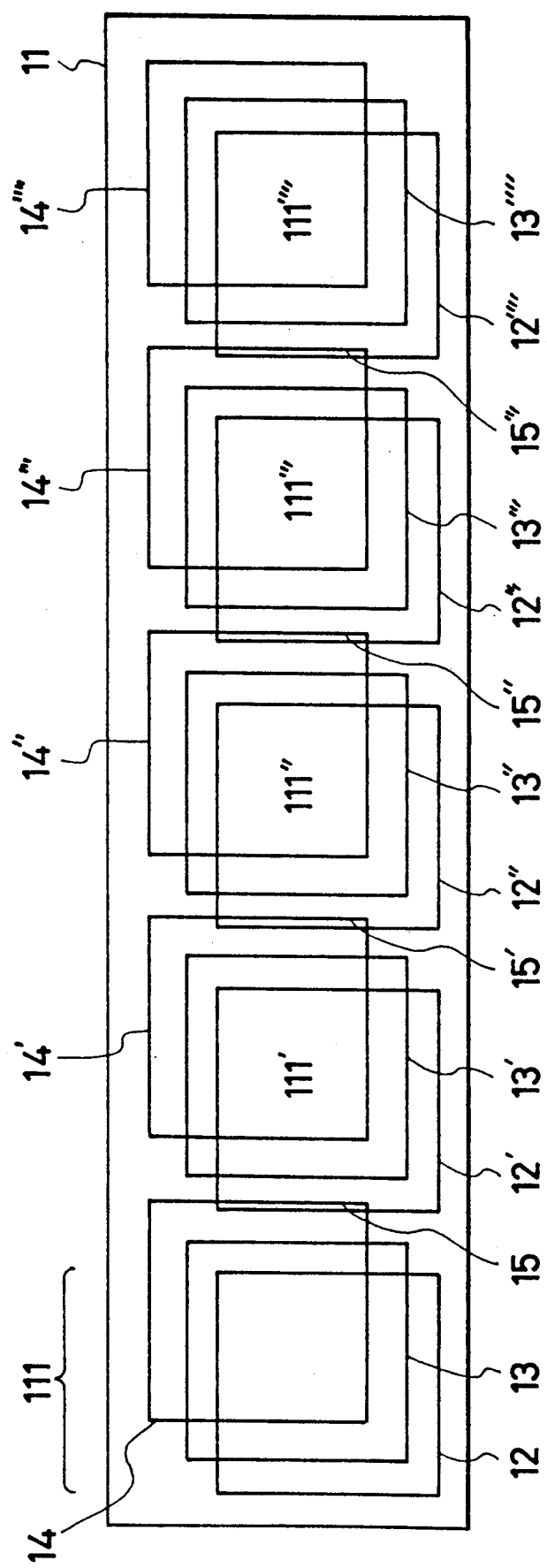

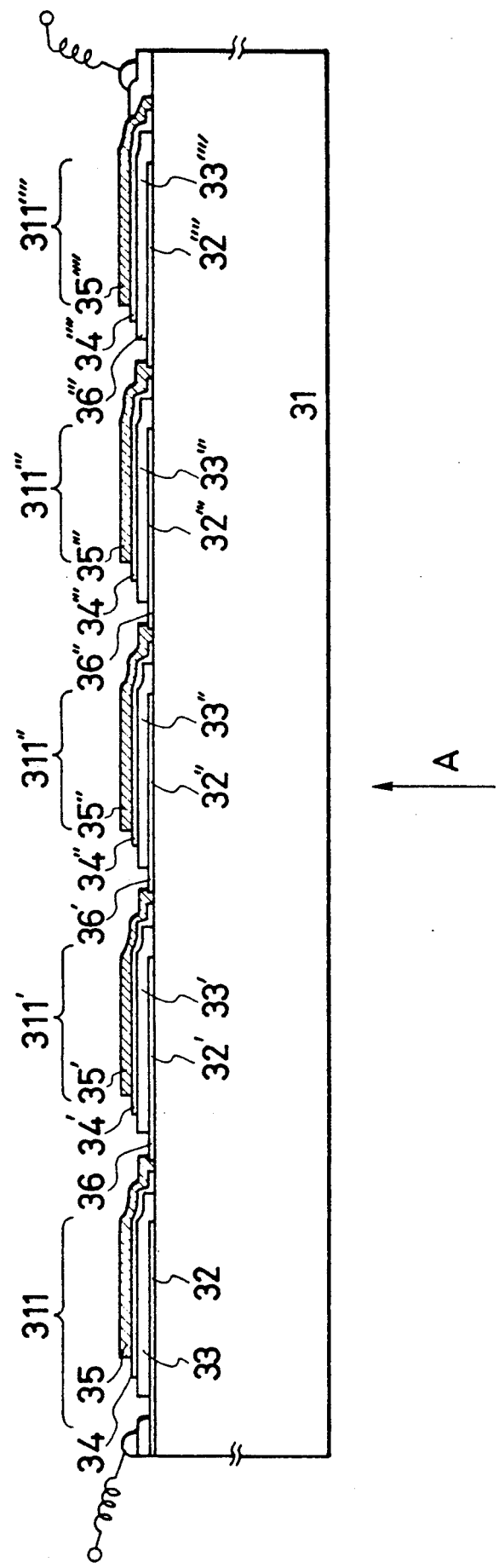

PHOTOELECTRIC CONVERSION DEVICE

BACKGROUND OF THE INVENTION

The present invention relates to a photoelectric conversion device for use in solar cells, photodiodes, phototransistors, light sensors, solid-state cameras and so forth.

Owing to the increasing demand for energy and decreasing availability of nonrenewable energy sources such as fossil fuels, photovoltaic power has become increasingly attractive. There are marketed a variety of electric appliances powered by solar energy sources. The utilization of solar energy is promoted by economical manufacture and ease of processing.

An example of conventional solar cells is illustrated in FIG. 1. The solar cell comprises a Corning #7059 glass substrate 41, a SnO2 film patterned into a plurality of transparent electrodes 42-42'''', an amorphous silicon semiconductor film including a PIN junction and patterned into a plurality of photosensitive layers 43-43'''' covering the transparent electrodes, respectively, and an Al film patterned into a plurality of upper electrodes. By this configuration, connected in series are five individual electric conversion structures 411-411'''', in which the edge portions 45, 45', 45'', 45''' of Al electrodes 44, 44', 44'', 44'''' respectively, contact on transparent electrodes 42', 42'', 42''', 42'''', and e.g., the structure 411 comprises a transparent electrode 42, a photosensitive layer 44 and an Al electrode 44. The patterning of each film is performed by photolithography, laser patterning, masking methods and the like. The effective area of each conversion device is 1 cm × 1 cm, for example. In accordance with our experiments, the open voltage, the fill factor and the short current of each structure of the illustrated solar cell were measured to be 2.7 V, 0.68 and 11 microamperes, respectively, when measured under illumination of 100 1× fluorescent light A. It is desirable if a further simplified process or structure is possible without degrading the performance thereof.

SUMMARY OF THE INVENTION

It is therefore an object of the present invention to provide a photoelectric conversion device of simple structure.

It is another object of the present invention to make the configuration of photoelectric conversion devices simple and economical without degrading the performance thereof.

In order to accomplish the above and other objects and advantages, a photoelectric conversion device consisting of a plurality of series connected individual photosensitive semiconductor structures is constructed in order that the semiconductor structures are connected to each other substantially only by means of the constituent semiconductor films. Namely, the series connection between adjacent photosensitive structures is made by electrical contact between the uppermost constituent semiconductor film of one structure and the lowermost semiconductor film of an adjacent structure.

BRIEF DESCRIPTION OF THE DRAWING

This invention can be better understood from the following detailed description when read in conjunction with the drawing in which

FIGS. 2A and 2B are cross-sectional and plan views showing a photoelectric conversion device in accordance with a first embodiment of the present invention.

FIG. 4 is a cross-sectional view showing a photoelectric conversion device in accordance with a third embodiment of the present invention.

DETAILED DESCRIPTION OF THE PREFERRED EMBODIMENTS

Figure 1:
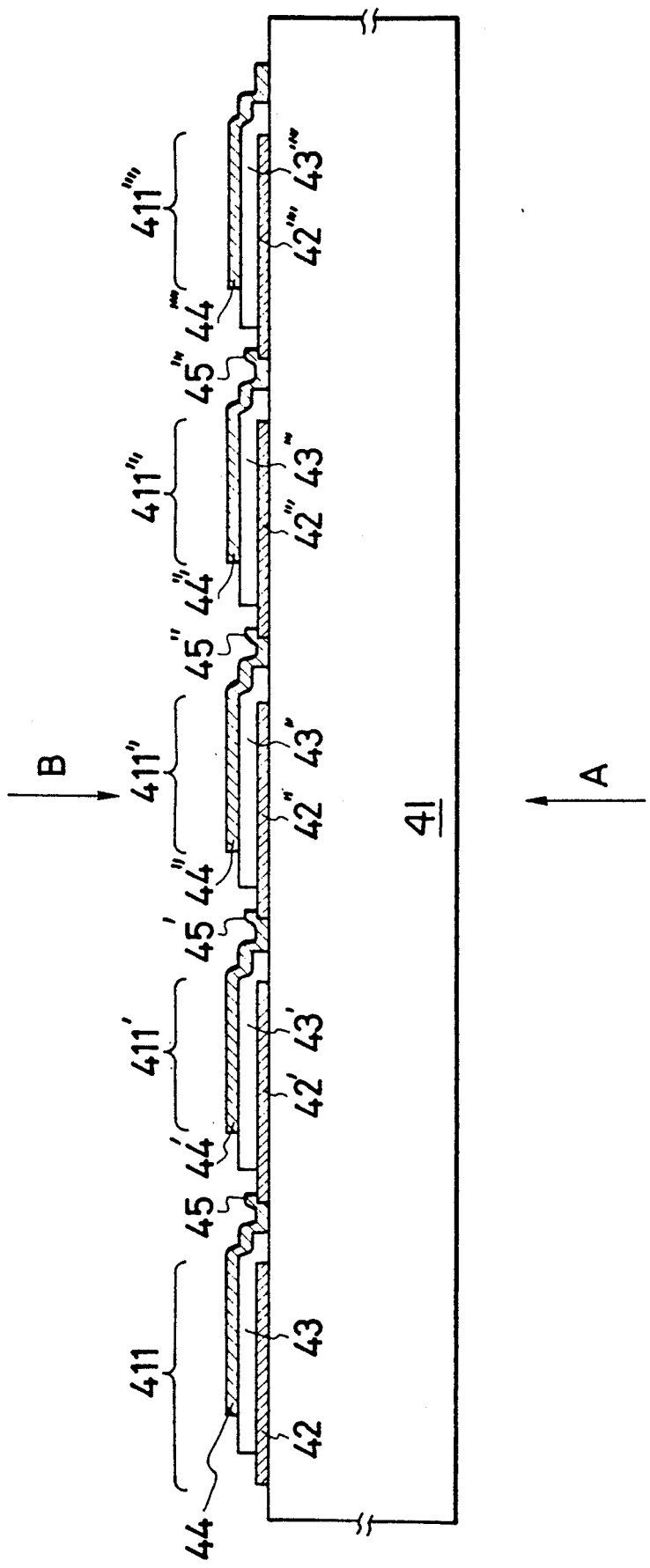
FIG. 1 is a cross-sectional view showing a prior art photoelectric conversion device.

Referring now to FIGS. 2(a) and 2(b), a solar cell in accordance with the present invention is illustrated. The solar cell comprises a 0.7 mm thick Corning #7059 glass substrate, and five individual photoelectric conversion structures 111-111'''' formed thereon and connected in series with each other. For example, the photoelectric conversion structure 111 consists of a P-type microcrystalline silicon semiconductor film 12 of 1000 Å thickness, an intrinsic amorphous silicon semiconductor film 13 of 5000 Å thickness, and an N-type microcrystalline silicon semiconductor film 14 of 1000 Å thickness. The conductivities of the semiconductor films 12 and 14 are each 1 Scm$^{-1}$. The other four structures 111''-111'''' have the same configuration as the structure 111. The conductivity of the intrinsic amorphous semiconductor film 13 is $10^{-10}$ to $10^{-11}$ Scm$^{-1}$ in a dark condition and $10^{-4}$ to $10^{-5}$ Scm$^{-1}$ under illumination. Of course, although the solar cell includes five structures in this figure, it is only for illustration purposes and a greater or lesser number of structures can be formed in the same manner.

The solar cell may be manufactured in a multichamber CVD apparatus which comprises three reaction chambers coupled with each other in order to process substrates sequentially therethrough. Namely, in a first chamber, the five P-type semiconductor films 12-12'''' are deposited using a mask having five apertures corresponding to the respective films and after deposition of the films, the substrate is transported to a second chamber; in the second chamber, the five intrinsic amorphous semiconductor films 13-13'''' are deposited using the same mask as was used for films 12-12'''', the mask having been displaced, relative to the substrate, from the position for the deposition of the P-type films 12-12'''' shown in FIG. 2(B) to that shown for films 13-13'''', and so as to prevent each intrinsic amorphous film from contacting an adjacent P-type film; and after transporting the substrate to a third chamber, the five N-type semiconductor films 14-14'''' are deposited, again, using the same mask, this mask having been displaced, relative to the substrate, from the position for the deposition of the intrinsic amorphous films 13-13'''' to that shown for the semiconductor films 14-14'''' in a manner causing edge portions 15-15''' of films 14'-14'''' to make electrical contact with the adjacent P-type films 12-12'''', respectively, as clearly illustrated in FIG. 2(B). The area 15, 15', 15'', 15''' or 15'''' of each semiconductor film is 1 cm × 1 cm, corresponding to the area of the mask. The electricity generated by this solar cell may be taken out by means of leads that are soldered to the semiconductor film 12 and the semiconductor film 14''''.

From experiments, the open-circuit voltage, the fill factor, and the short circuit of each structure of the illustrated solar cell were measured to be 2.63 V, 0.66 and 9 microamperes, respectively, when measured under illumination of 100 1× fluorescent light A.

Figure 3:
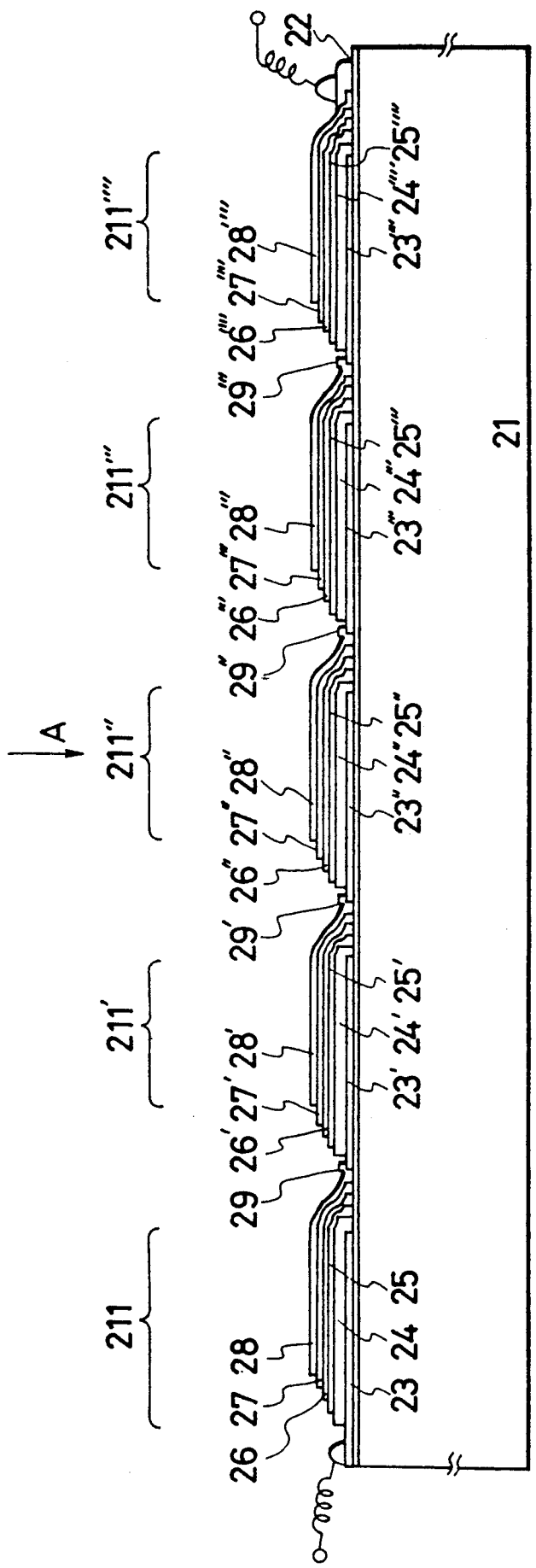
FIG. 3 is a cross-sectional view showing a photoelectric conversion device in accordance with a second embodiment of the present invention.

FIG. 3 is a cross-sectional view showing a solar cell in accordance with a second embodiment. The solar cell of this embodiment comprises a stainless steel substrate 21 which has been made smooth by electrolytic polishing, a polyimide film 22 coating the entire upper surface of the substrate 21, and five individual photoelectric conversion structures 211-211'''' being formed thereon and connected in series with each other. For example, the photoelectric conversion structure 211 consists of an N-type microcrystalline silicon semiconductor film 23 of 1000 Å thickness, an intrinsic amorphous silicon semiconductor film 24, a P-type amorphous silicon semiconductor film 25, an N-type amorphous silicon semiconductor film 26, an intrinsic amorphous silicon semiconductor film 27, and a P-type microcrystalline silicon semiconductor film 28 of 1000 Å thickness. The other four structures 211'-211'''' have the same configuration as the structure 211. These films are deposited by CVD in laminate form. The area of each semiconductor film is 1 cm×1 cm. The manufacturing process is substantially the same as that described for the preceding embodiment, and results in an electrical connection between edge portions 29-29''' of films 28-28''' and the films 23'-23''''.

From experiments, the open-circuit voltage, the fill factor and the short current of each structure of the illustrated solar cell were measured to be 4.47 V, 0.67 and 4 microamperes, respectively, when measured under illumination of 100 1× fluorescent light A.

FIG. 4 is a cross-sectional view showing a solar cell in accordance with a third embodiment. The solar cell of this embodiment comprises a glass substrate 31, and five individual photoelectric conversion structures 311-311'''' formed thereon and connected to each other in series. For example, the photoelectric conversion structure consists of a P-type microcrystalline silicon semiconductor film 32 of 1000 Å thickness, an intrinsic amorphous silicon semiconductor film 33, a N-type amorphous silicon semiconductor 34 of 400 Å thickness and an Al electrode segment 35 of 2000 Å thickness deposited by vapor evaporation. The conductivity of the N-type semiconductor film is $10^{-9}$ Scm$^{-1}$. The other four structures have the same configuration as the structure 211. The area of each semiconductor film is 1 cm×1 cm. Each pair of adjacent structures is interconnected through the Al electrode segments as shown in FIG. 4. Namely, unlike the first embodiment as illustrated in FIGS. 2(A) and 2(B), each N-type film 34-34''' does not make direct contact with the adjacent P-type film 32'-32'''' but does make electrical contact with the edge portions 36'-36'''' of P-type film via the Al segments 35'-35''''. The manufacture process is substantially the same as the preceding embodiment.

For experiments, the open-circuit voltage, the fill factor and the short current of the illustrated solar cell were measured to be 2.81 V, 0.68 and 10 microamperes, respectively, when measured under illumination of 100 1× fluorescent light A. The relatively large short current is considered to be due to the reflection action of the Al electrode segments.

While several embodiments have been specifically described by way of examples, it is to be appreciated that the present invention is not limited to the particular examples described and that modifications and variations can be made without departing from the scope of the invention as defined by the appended claims. For example, the photosensitive semiconductor structure can be formed in any configuration which have been proposed in the field.

What is claimed is:

1. In a photoelectric conversion device having a plurality of individual photoelectric conversion structures which are formed on an insulating surface of a substrate and connected in series to each other, each structure comprising:
   a first semiconductor film of a first conductivity type;
   an intrinsic semiconductor film formed on said first semiconductor film such that one end thereof extends beyond an end of said first semiconductor film;
   a second semiconductor film formed over said intrinsic semiconductor film and having a second conductivity type opposed to said first conductivity type such that one end thereof extends beyond the extended end of said intrinsic semiconductor film and make electrical contact with an end of the first semiconductor film of an adjacent structure wherein said electrical contact is a direct contact between said first and second semiconductor films.

2. The device of claim 1 wherein said first and second semiconductor films are made of a microcrystalline semiconductor.

3. The device of claim 2 wherein said intrinsic semiconductor film is made of an amorphous semiconductor.

4. The device of claim 1 wherein said substrate is transparent and each structure further comprising a reflective metallic film covering the second semiconductor film.

5. A photoelectric conversion device comprising:
   a substrate having an insulating surface; and
   a plurality of photoelectric conversion elements formed on said substrate and connected in series, each element comprising, in order, a first semiconductor layer of a first conductivity type, a second semiconductor layer of an intrinsic conductivity type and a third semiconductor layer of a second conductivity type opposite to said first conductivity type,
   wherein the third semiconductor layer of one element is directly connected to the first semiconductor layer of its adjacent element.

6. A photoelectric conversion device according to claim 5 wherein said first and third semiconductor layers comprise microcrystalline silicon and said second semiconductor layer comprises amorphous silicon.

7. A photoelectric conversion device comprising:
   a substrate having an insulating surface; and
   a plurality of photoelectric conversion elements formed on said substrate, each element comprising a first semiconductor layer of a first conductivity type, a second semiconductor layer of an intrinsic conductivity type, a third semiconductor layer of a second conductivity type opposite to said first conductivity type and an electrically conductive layer, in this order,
   wherein said electrically conductive layer of one element is directly connected to a first semiconductor layer of an adjacent element.

8. A photoelectric conversion device according to claim 7 wherein at least said first semiconductor layer comprises microcrystalline silicon.

9. A photoelectric conversion device according to claim 7 wherein said electrically conductive layer is reflective.

10. A photoelectric conversion device comprising:
a substrate; and
a plurality of photoelectric conversion elements formed on said substrate and connected in series to each other, wherein each element comprises at least one pin junction,
wherein a lowermost semiconductor layer of one of said elements is directly connected to an uppermost semiconductor layer of another element adjacent thereto.

11. A photoelectric conversion device according to claim 10 wherein said photoelectric conversion element comprises two pin junctions laminated on said substrate.

* * * * *